(12) United States Patent
Kim et al.

(10) Patent No.: US 7,074,682 B2
(45) Date of Patent: Jul. 11, 2006

(54) METHOD FOR FABRICATING A SEMICONDUCTOR DEVICE HAVING SELF ALIGNED SOURCE (SAS) CROSSING TRENCH

(75) Inventors: Jum Soo Kim, Icheon (KR); Sung Mun Jung, Kyungki-do (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/951,503

(22) Filed: Sep. 27, 2004

(65) Prior Publication Data

US 2005/0074925 A1    Apr. 7, 2005

(30) Foreign Application Priority Data

Oct. 1, 2003  (KR) .................. 10-2003-0068499
Oct. 1, 2003  (KR) .................. 10-2003-0068500

(51) Int. Cl.
*H01L 21/71* (2006.01)

(52) U.S. Cl. ............................................. 438/296
(58) Field of Classification Search ................ 438/296
See application file for complete search history.

(56) References Cited

U.S. PATENT DOCUMENTS

| | | | | |
|---|---|---|---|---|
| 5,447,877 A | * | 9/1995 | Sasaki | 438/257 |
| 5,470,773 A | * | 11/1995 | Liu et al. | 438/264 |
| 5,482,881 A | * | 1/1996 | Chen et al. | 438/264 |
| 5,656,513 A | * | 8/1997 | Wang et al. | 438/262 |
| 5,933,730 A | * | 8/1999 | Sun et al. | 438/258 |
| 6,008,516 A | * | 12/1999 | Mehrad et al. | 257/315 |
| 6,211,020 B1 | * | 4/2001 | Tripsas et al. | 438/294 |
| 6,218,265 B1 | * | 4/2001 | Colpani | 438/424 |
| 6,228,715 B1 | * | 5/2001 | Shimoji | 438/264 |
| 6,235,581 B1 | * | 5/2001 | Chen | 438/257 |
| 6,436,751 B1 | * | 8/2002 | Liou et al. | 438/211 |
| 6,448,608 B1 | | 9/2002 | Pham et al. | |
| 6,524,914 B1 | | 2/2003 | He et al. | |
| 6,737,321 B1 | * | 5/2004 | Lee | 438/264 |
| 2003/0011023 A1 | * | 1/2003 | Hurley | 257/315 |
| 2003/0013253 A1 | * | 1/2003 | Hurley | 438/257 |
| 2003/0022500 A1 | * | 1/2003 | Tang | 438/692 |
| 2003/0143790 A1 | * | 7/2003 | Wu | 438/197 |
| 2003/0232472 A1 | * | 12/2003 | Wu | 438/257 |
| 2004/0079987 A1 | * | 4/2004 | Shimizu | 257/315 |
| 2004/0161706 A1 | * | 8/2004 | Jung et al. | 430/311 |
| 2004/0166631 A1 | * | 8/2004 | Hurley | 438/257 |

* cited by examiner

*Primary Examiner*—Evan Pert
(74) *Attorney, Agent, or Firm*—Andrew D. Fortney

(57) ABSTRACT

In order to provide a method for preventing the channel length from being shortened as well as reducing the SAS resistance, the semiconductor device according to the present invention is manufactured by forming continuous linear trench lines on a semiconductor substrate, forming gate oxide lines on the semiconductor substrate between the trench lines, forming gate lines on the trench lines and the gate oxide lines, the gate lines being substantially perpendicular to the trench lines, etching the gate oxide lines and trench lines positioned between the gate lines, to form an etched region forming self aligned sources (SASs) by implanting impurity ions into the etched region, forming spacers on sidewalls of the gate lines, and implanting impurity ions in the SAS region using the spacers as a mask.

20 Claims, 10 Drawing Sheets (BACKGROUND)

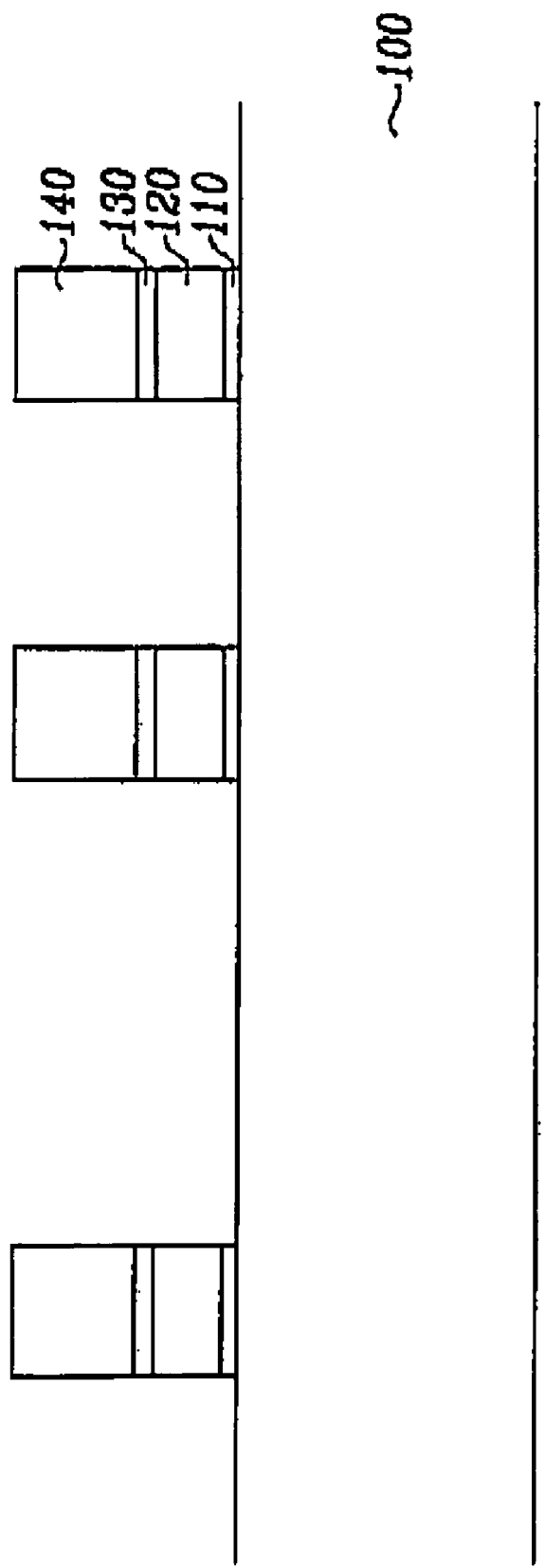

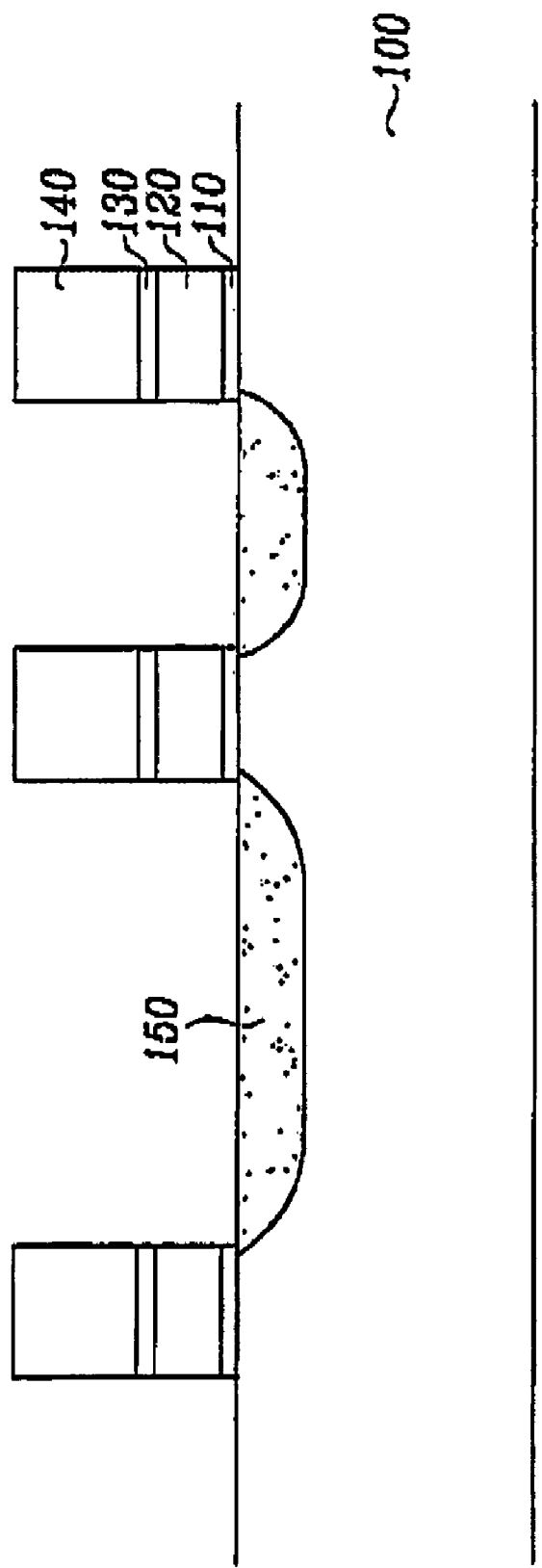

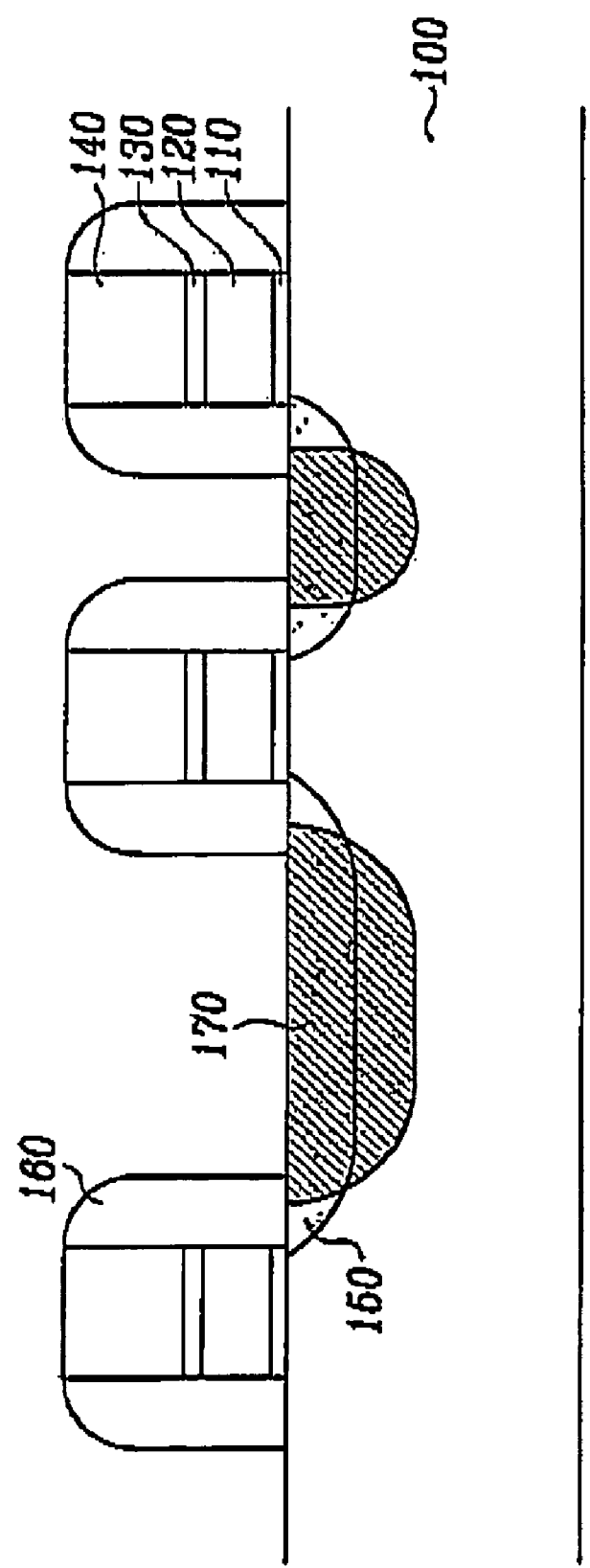

METHOD FOR FABRICATING A SEMICONDUCTOR DEVICE HAVING SELF ALIGNED SOURCE (SAS) CROSSING TRENCH

BACKGROUND OF THE INVENTION (a) Field of the Invention

The present invention relates to a method for fabricating a semiconductor device and, in particular, to a method for reducing SAS resistance at a cell region of the semiconductor device.

(b) Description of the Related Art

Recently, as flash memories are widely utilized and price competition grows, various technologies have been developed for reducing the sizes of the devices. One of those is a self aligned source (SAS) technique.

The SAS technique is a method for reducing the cell size in a bit line direction and is essentially adopted for below −0.25 μm line width technology since it can reduce a gap between the gate and the source such that the cell size can be reduced about 20% with the introduction of the SAS technique.

However, the conventional SAS technique has a drawback in that the contact resistance of the source per cell dramatically increases because the SAS region is formed along the trench profile.

In the meantime, the below −0.25 μm or below −0.18 μm technology utilizes a shallow trench isolation (STI) technique for fabricating most semiconductor devices.

That is, the STI technique and the SAS technique are essential to reduce the cell size in a word line direction and a bit line direction, respectively. However, simultaneous adaptation of these two techniques causes a dramatic increase in the source resistance.

Especially, in the case of flash memory the reduction of the cell size may require increased depth of the trench due to a relatively high internal voltage, resulting in deterioration of the source resistance.

Conventional ion implantation techniques for the flash memories have been disclosed in the U.S. Pat. Nos. 6,524,914 and 6,448,608.

In case of As (arsenic) ion implantation for flash memory, the resistance per cell increases to be about 780 Ohm when the depth of the trench is 3600 Å, while the resistance per cell is about 400 Ohm when the trench depth is 2400 Å.

Also, in the case of P ion implantation, the resistance per cell increases to be about 450 Ohm with the trench depth of 3600 Å, while it is 250 Ohm with the trench depth of 2400 Å.

In case of an embedded flash, it is required that the reading and programming operation to be unaffected by the source resistance. However, since the trench depth of the logic transistor is 3500 Å in the flash memory cell adopted the 0.18 μm technology and the As ion implantation, the resistance per cell becomes 700–900 Ohm which is double of the required resistance, resulting in bad effects such as degradation of cell programming and reduction of reading speed.

In order to solve this problem, it can be considered to additionally implant the P (phosphorous) ions. FIG. 1 is a graph illustrating variation of the source resistance to the trench depth when only the As is ion implanted and the As and additional P are ion implanted, respectively. As shown in FIG. 1, the As and additional P implantation shows much reduction of the source resistance compared to the case of the As ion implantation.

Even though it is expected that the source resistance decreases by implanting the additional P ions after the gate formation, however, the channel length becomes shortened as much as about 0.24 μm, resulting in a punch through problem.

Also, the additional ion implantation has a shortcoming of hindering minimization of the proposed device.

SUMMARY OF THE INVENTION

The present invention has been made in an effort to solve the above problems, and it is an object to provide a method for avoiding the resistance increase caused by the adaptation of the SAS technique with trench isolation, such as STI.

It is another object of the present invention to provide a method for preventing the channel length from being shortened as well as solving the SAS resistance problem.

In order to achieve the above objects, a method for fabricating a semiconductor device of the present invention includes forming continuous linear trench lines on a semiconductor substrate, forming gate oxide lines on the semiconductor substrate between the trench lines, forming gate lines on the trench lines and the gate oxide lines, the gate lines being substantially perpendicular to the trench lines, etching the gate oxide lines and trench lines positioned between the gate lines to form an etched region, forming self aligned sources (SASs) by implanting impurity ions into the etched region, forming spacers on sidewalls of the gate lines, and implanting impurity ions in the SAS region using the spacers as a mask.

The method can further include forming a thermal oxide layer on the sidewalls of the gate lines after forming the SASs and before forming the spacers.

Preferably, the step of forming the spacers includes forming a spacer layer on an entire surface of the gate lines, and etching back or chemical-mechanical-polishing the spacer layer until an upper surface of the gate lines being exposed in order for the spacer layer to be remained only on the sidewalls of the gate lines.

Preferably, the spacers are made from one of nitride, oxide, and oxynitride.

Preferably, each spacer is formed at a width in the range of 100–1500 Å.

Preferably, the impurity ions are Ge ions and are injected as much as $1 \times 10^{14} – 5 \times 10^{15}/cm^3$.

Preferably, the As ions are injected in an energy of 5–40 keV.

Preferably, the trench lines are parallel with a bit line and the gate lines are parallel with a word line.

Preferably, the gate oxide lines and the trench lines are etched using a mask which exposes some parts of the gate lines and areas between the gate lines.

Preferably, the step of etching the gate lines and trench lines is performed in a condition that etching speed of a dielectric material constituting the trench lines is faster than that of the semiconductor substrate.

Preferably, dielectric material composing the trench line is oxide.

Preferably, the gate lines are composed of a first polycrystalline silicon layer, a dielectric layer, and a second polycrystalline silicon layer.

The method further includes injecting impurity ions of element which is different from that of the semiconductor substrate and belonged to an identical group before forming the SAS region.

Preferably, the semiconductor substrate is a silicon wafer, and the impurity ions are Ge ions that are injected as much as $1 \times 10^{14} - 5 \times 10^{15}/cm^3$.

Also, along with the first impurity material, it is preferred that one or a mixture gas of at least two of non-volatile gases including Ar, Xe, and Kr.

A method for fabricating the semiconductor device includes forming continuously linear trench lines on a semiconductor substrate, forming gate oxide lines on the semiconductor substrate between the trench lines, forming gate lines on the trench lines and the gate oxide lines, the gate lines being substantially perpendicular to the trench lines, etching the gate oxide lines and trench lines positioned between the gate lines to form an etched region, injecting first impurity ions of element which is different from that of the semiconductor substrate and belonging to an identical group, and forming a self aligned source (SAS) by injecting second impurity ions of element belonging to a group different from that of the semiconductor substrate into the etched region.

Preferably, the semiconductor substrate is a silicon wafer and the second impurity ions are any of As and P, the As and P ions being sequentially injected.

BRIEF DESCRIPTION OF THE DRAWINGS

FIG. 3a to FIG. 3d are cross sectional views illustrating fabricating steps of a semiconductor device, taken in a bit line direction, according to a first embodiment of the present invention.

DETAILED DESCRIPTION OF THE PREFERRED EMBODIMENTS

A preferred embodiment of the present invention will be described hereinafter with reference to the accompanying drawings in detail.

The SAS technique is a method for reducing the cell size in the bit line direction and is essentially adopted for below −0.25 μm linewidth technology since it can reduce a distance between the gate and the source.

Typically, a NOR type flash memory uses a common source scheme and one contact is formed per 16 cells.

Figure 1:
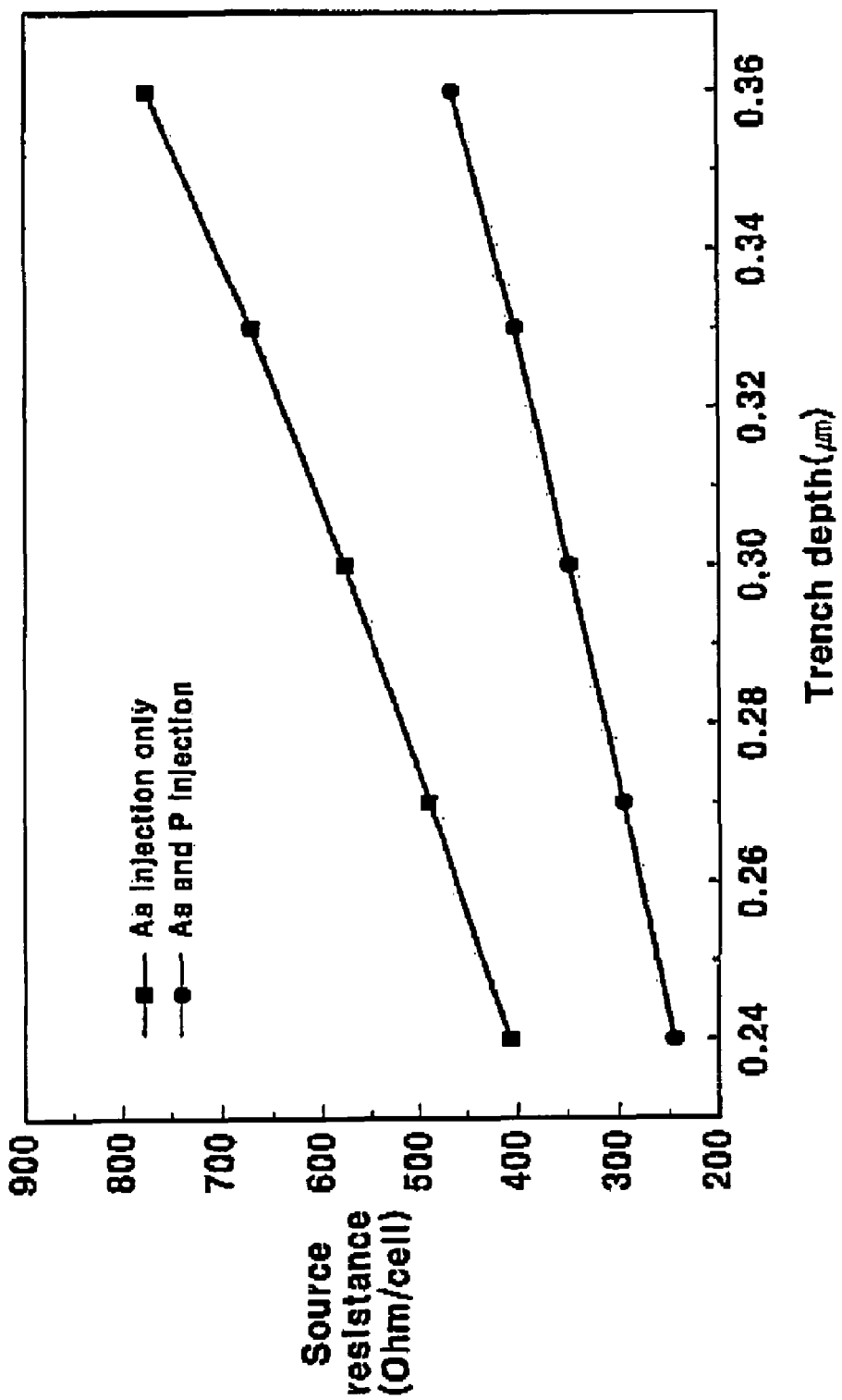
FIG. 1 is a graph illustrating a simulation result of variation of source resistance according to a depth of trench.
Figure 2A:
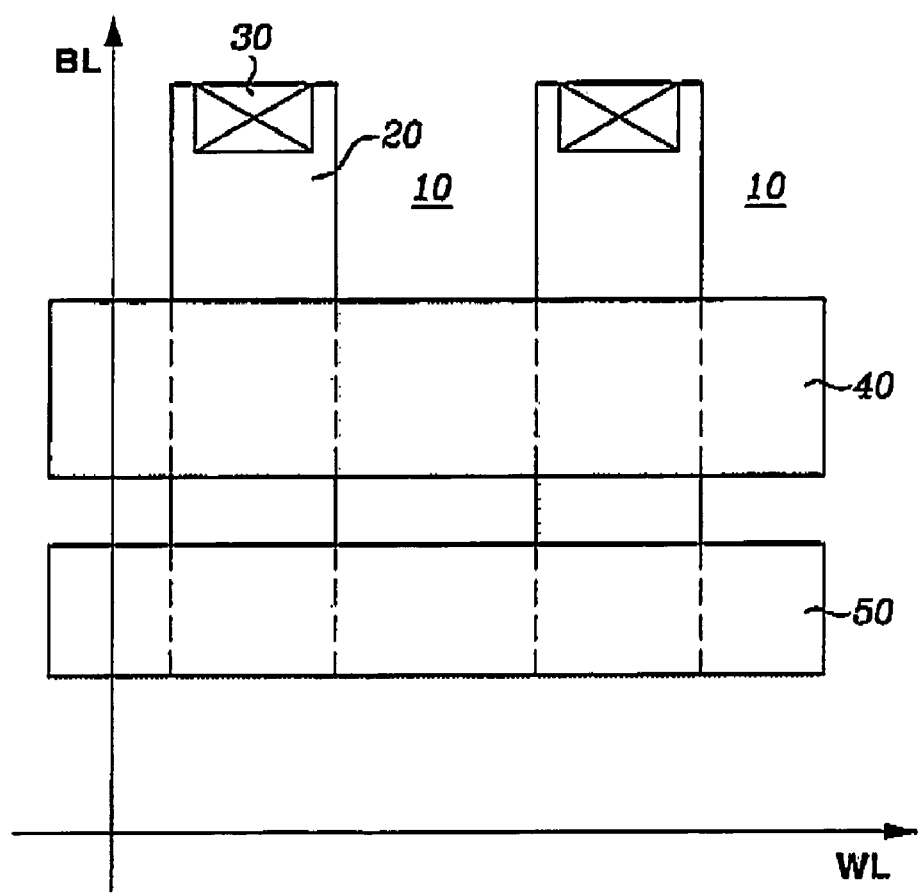
FIG. 2a is a plane view illustrating a conventional memory cell without introducing the SAS technique.
Figure 2B:
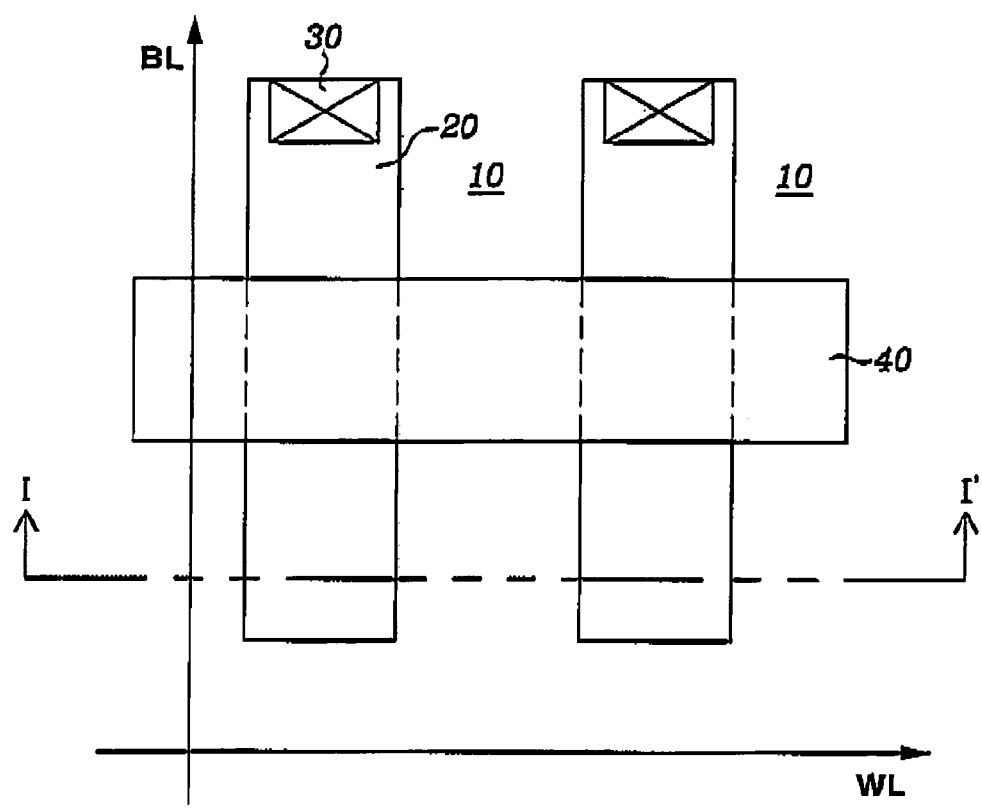
FIG. 2b is a plane view illustrating a memory cell introduced the SAS technique.
Figure 2C:
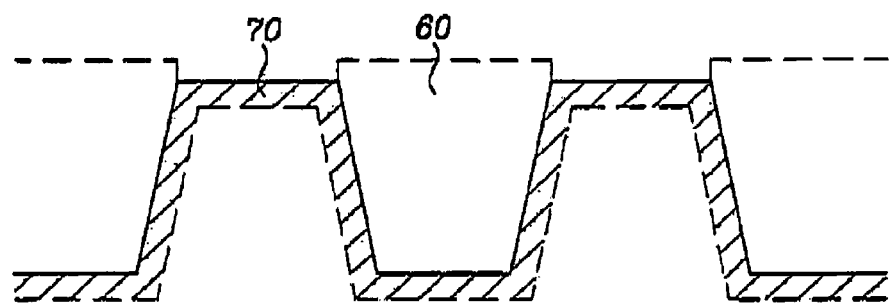
FIG. 2c is a cross sectional view taken along line I–I' in FIG. 2b.

FIG. 2a is a plane view illustrating a conventional memory cell without introducing the SAS technique, FIG. 2b is a plane view illustrating a memory cell introduced the SAS technique, and FIG. 2c is a cross sectional view taken along line I–I' in FIG. 2b.

In FIG. 2a, field oxide regions 10 as device isolation regions are formed in a bit line (BL), and active regions 20, in which devices are formed, are defined between the field oxide regions 10. A drain contact 30 is formed at each cell of the active region 20.

A gate line 40 is formed in a word line (WL) direction, and a common source line 50 is formed in parallel with the gate line 40 at a predetermined distance.

By introducing the SAS technique for forming the memory cell, as shown in FIG. 2b and FIG. 2c, a SAS region 70 is formed by implanting impurity ions after etching the field oxide region 60 formed in an area which corresponds to the typical common source line 50.

Since the SAS region 70 is formed along the trench profile, the contact resistance of the source per cell increases dramatically. The increase of the resistance is because the actual surface resistance extends along the trench profile and the resistivity of the sidewall in the trench is relatively high.

In order to compensate for shortening of the channel length caused when applying the additional ion implantation, the ions are implanted after spacers are formed on sidewalls of the gate line or Ge ions are implanted before the impurity ions are implanted for forming the SAS region.

The method for fabricating semiconductor device according to a first embodiment of the present invention will be described in detail.

FIG. 3a to FIG. 3d are cross sectional views illustrating fabricating steps of a semiconductor device, taken in a bit line direction, according to a first embodiment of the present invention.

As shown in FIG. 3a, firstly, linear trench lines are sequentially formed on a semiconductor substrate 100. The trench lines are formed in parallel with the bit line direction.

Next, gate oxide lines are formed on the semiconductor substrate 100 except the areas at which the trench lines are formed.

Next, gate lines are sequentially formed on the trench lines and the gate oxide lines 110 in vertical direction, i.e. in a direction parallel to the word lines.

Preferably, the gate lines are formed out of polycrystalline silicon such that a flash memory can be made by forming a first polycrystalline silicon layer 120, composite dielectric layer 130 such as an oxide-nitride-oxide layer (ONO), and a second polycrystalline silicon layer 140.

The gate oxide lines and the trench lines between the gate lines are etched. The etching process is carried out using the gate lines as a mask for exposing spaces between the gate lines and some parts of the gate lines.

Preferably, the dielectric material of trench line, i.e. the oxide layer is etched in a speed faster than that of the semiconductor substrate. That is, the oxide layer should have high etching selectivity.

Next, as shown in FIG. 3b, a self aligned source (SAS) 150 is formed by implanting impurity ions at the etched area.

The impurity can be As or P, and in case of slant As ion implantation, the As ion is implanted with a dose of $1 \times 10^{14} - 5 \times 10^{15}/cm^3$ at the energy of 5–40 keV.

Figure 3C:
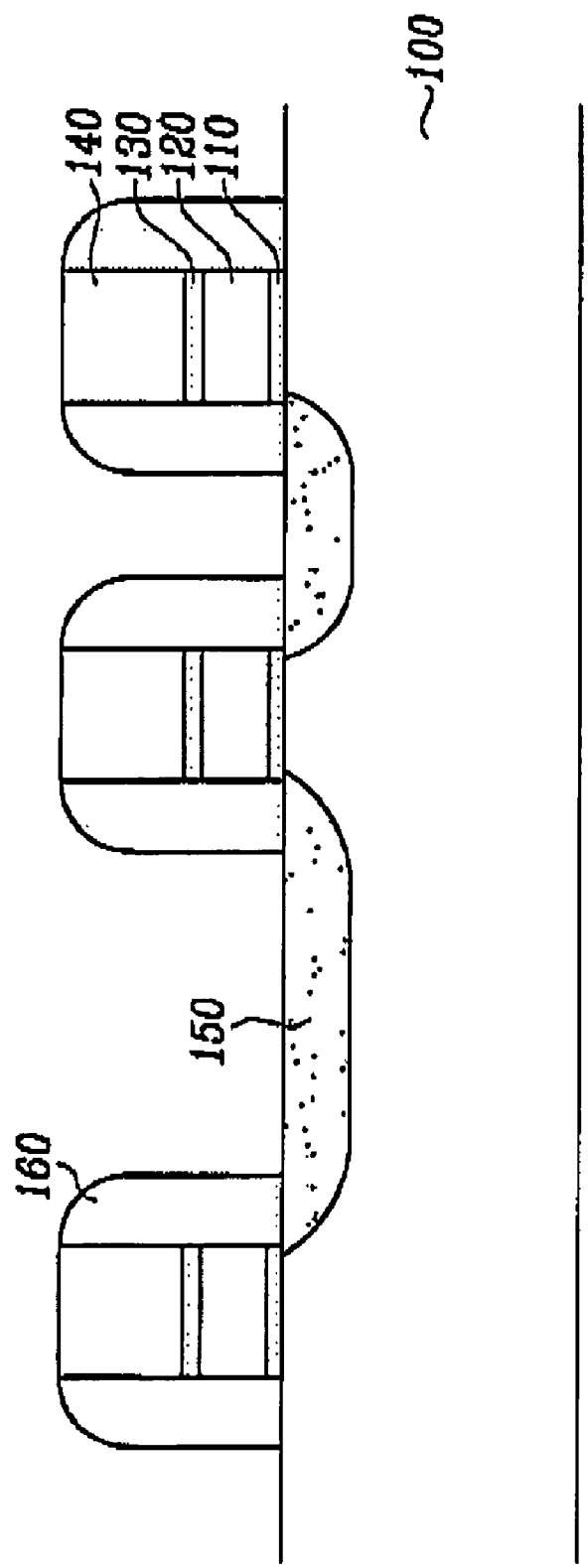

Next, as shown in FIG. 3c, spacers 160 are formed on sidewalls of the gate lines. In order to recover a damage caused by the ion implantation and to avoid charge loss of a floating gate (first polycrystalline silicon layer) 120, it is preferred to form a thermal oxide layer on the sidewalls of the gate lines before forming the spacers.

In order to form the spacer, the spacer layer is etched back or chemically mechanically polished to remain the spacer layer only on the sidewalls of the gate lines until the surface of the gate lines are exposed, after forming the spacer layer on the entire surface of the gate lines.

The spacer is formed out of nitride, oxide, or oxynitride.

Also, the spacers are preferably formed at a width in the range of 100–1500 Å.

Next, as shown in FIG. 3d, a second impurity region 170 is formed by additionally implanting the impurity ions using the spacer 160 as a mask.

The additionally implanted ion can be As or P, and in case of slanted ion implantation technique is adopted, the As ion is implanted in a dose of $1\times10^{14}$–$5\times10^{15}$/cm$^3$ with an energy in the range of 5–40 keV.

By performing the additional ion implantation after the spacer is formed in the above manner, it is possible to avoiding the punch through effect since the channel length is not affected.

In case of a NOR type flash cell, however, programming is carried out by hot carrier implantation. For this reason, lightly doped drain (LDD) or DDD is not formed at a source and drain junction of the cell. However, in case of implanting the As or P is implanted after forming the spacer, a step junction is formed so as to degrade the programming efficiency, such that the spacer is formed at a thickness enough and the ion implantation energy and the dose should be well adjusted according to the spacer for avoiding the programming efficiency degradation.

Next, a second preferred embodiment of the present invention in which Ge ions are implanted before the impurity ion implantation is performed for forming the SAS region.

In the second embodiment of the present invention, firstly, the linear trench lines are sequentially formed on the semiconductor substrate.

Next, gate oxide lines are formed on the semiconductor substrate except the areas at which the trench lines are formed.

Next, gate lines are sequentially formed on the trench lines and the gate oxide lines 110 in vertical direction, i.e. in a direction parallel to the word lines.

Preferably, the gate lines are formed out of polycrystalline silicon such that a flash memory can be made by forming a first polycrystalline silicon layer, composite dielectric layer such as an oxide-nitride-oxide layer (ONO), and a second polycrystalline silicon layer.

Next, the gate oxide lines and the trench lines between the gate lines are etched. The etching process is carried out using the gate lines as a mask for exposing spaces between the gate lines and some parts of the gate lines.

Preferably, the dielectric material of the trench line, i.e. the oxide layer is etched in a speed faster than that of the semiconductor substrate. That is, the oxide layer should have a high etching selectivity.

Next, first impurity ions of identical group but different element in the periodic table is implanted.

In case of using a silicon wafer as the semiconductor substrate, the first impurity ion can be Ge. Preferably, the Ge ion is implanted in a dose of $1\times10^{14}$–$5\times10^{15}$/cm$^3$.

Also, along with the first impurity material, it is preferred that one or mixture gas of at least two of non-volatile gases including Ar, Xe, and Kr.

Next, a self aligned source (SAS) region is formed by implanting second impurity ions belonging to a group different from the group including the semiconductor substrate.

The second ion impurity can be As or P, and the As and P ions can be implanted sequentially.

The second ion impurity can be implanted in a dose of $1\times10^{14}$–$5\times10^{15}$/cm$^3$ with the energy in the range of 5–40 keV.

As described above, by implanting the second impurity ion belonging to the periodic table group different from the group including the semiconductor substrate element after implanting the first impurity ion belong to the group to which the element of the semiconductor substrate belongs but different, the junction depth becomes shallow such that it is possible to prevent the channel length from being shortened.

Figure 4:
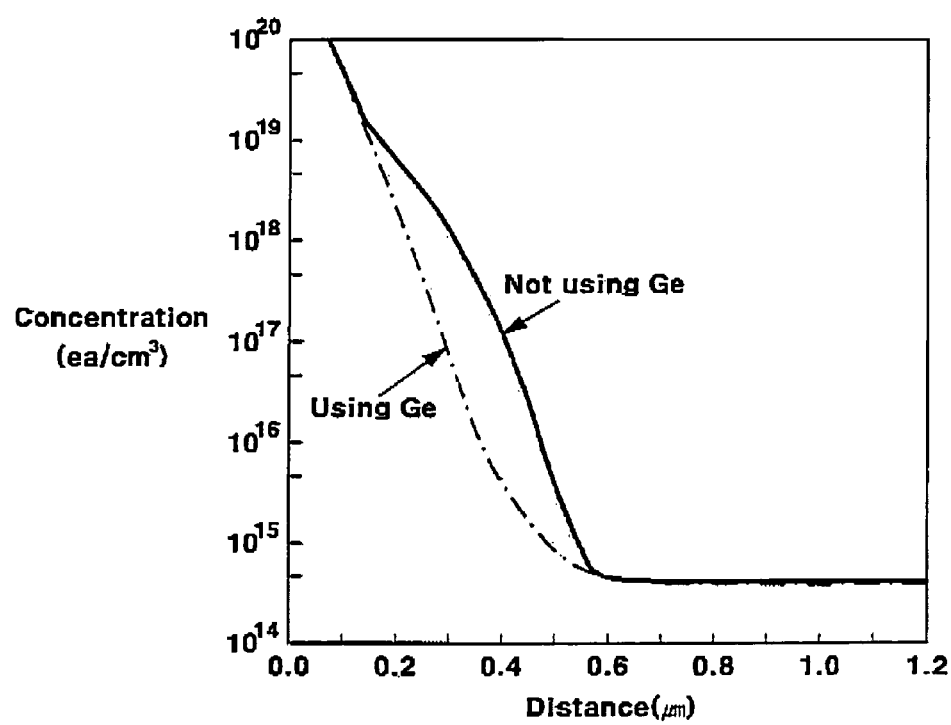
FIG. 4 is a graph illustrating a relationship between P ion implantation thickness and density in cases of using Ge and not using Ge.
Figure 5:
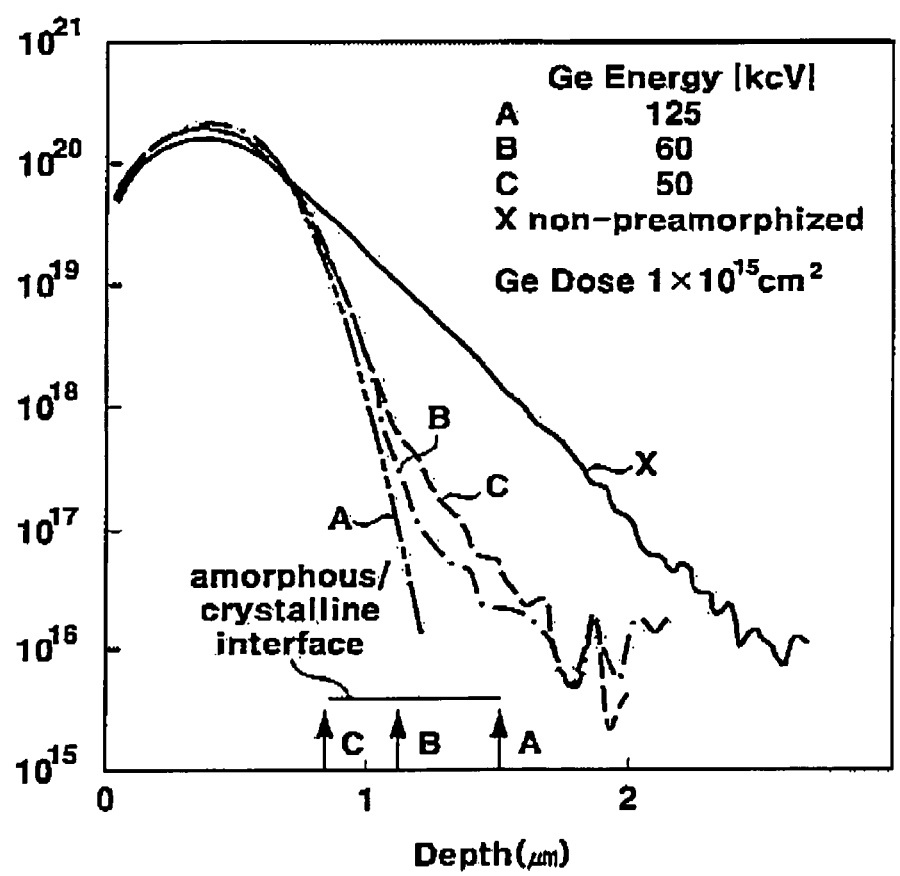
FIG. 5 is a graph illustrating a relationship between the junction thickness and ion density in case of using various ion implantation energy.

FIG. 4 is a graph illustrating a relationship between P ion implantation thickness and density in cases of using Ge and not using Ge, and FIG. 5 is a graph illustrating a relationship between the junction thickness and ion density in case of using various ion implantation energy.

As shown in FIG. 4 and FIG. 5, it is shown that the ion implanted thickness, i.e. the junction depth has become shallow when the Ge ion is implanted before implanting the P ion relative to the case of not implanting Ge ion.

Also, this can be adopted to the first embodiment and the second embodiment of the present invention. That is, the SAS region is formed implanting the ion impurity after the Ge ion is implanted. Further, the additional ion implantation can be formed after the spacers are formed on the sidewalls.

As described above, since the second impurity ion of which element belongs to the different group of the element of the semiconductor substrate is implanted after the first impurity ion (Ge), of which element belongs to the same group but is different from that of semiconductor substrate, being implanted before implanting the impurity ion for reducing the SAS resistance, it is possible to shallow the ion implanted thickness, resulting in avoidance of shortening the channel length.

Also, since the second ion implantation is carried out after forming the spacers on the sidewalls of the gate lines after implanting the first ion in the additional impurity ion implantation method for reducing the SAS resistance according to the present invention, it is possible to reduce the SAS resistance as well as prevent the additionally implanted ions from affecting the channel depth due to the spacers.

Also, it is possible to avoid reduction of the channel length and occurrence of punch through effect.

What is claimed is:

1. A method for fabricating a semiconductor device, comprising the steps of:
    forming continuous linear trench lines on a semiconductor substrate;
    forming gate oxide lines on the semiconductor substrate between the trench lines;
    forming gate lines on the trench lines and the gate oxide lines, the gate lines being substantially perpendicular to the trench lines;
    etching the gate oxide lines and the trench lines positioned between the gate lines to form an etched region;
    forming a self aligned sources (SAS) region by implanting impurity ions into the etched region;
    forming spacers on sidewalls of the gate lines; and
    implanting further impurity ions in the SAS region using the spacers as a mask.

2. The method of claim 1 further comprising forming a thermal oxide layer on the sidewalls of the gate lines after forming the SAS region and before forming the spacers.

3. The method of claim 1, wherein the step of forming the spacers includes:
    forming a spacer layer on an entire upper surface of the gate lines; and
    etching back or chemical-mechanical-polishing the spacer layer until an upper surface of the gate lines is exposed such the spacer layer remains on the sidewalls of the gate lines.

4. The method of claim 1, wherein the spacers comprise one of a nitride, an oxide, and an oxynitride.

5. The method of claim 1, wherein the step of etching the gate oxide lines and the trench lines is performed using a mask which exposes parts of the gate lines and areas between the gate lines.

6. The method of claim 1, wherein, in the step of etching the gate oxide lines and the trench lines, an etching speed of a dielectric material constituting the trench lines is faster than an etching speed of the semiconductor substrate.

7. The method of claim 1, wherein the trench lines comprise an oxide layer, and the gate lines comprise a first polycrystalline silicon layer, a dielectric layer, and a second polycrystalline silicon layer.

8. The method of claim 1 further comprising the step of: injecting into the etched region impurity ions of elements which are different from that of the semiconductor substrate and belong to the same group as the substrate before forming the SAS region.

9. The method of claim 8, wherein the semiconductor substrate comprises a silicon wafer and said impurity ions comprise Ge ions.

10. The method of claim 9, wherein the injecting step comprises injecting the Ge ions at concentration of $1 \times 10^{14}$–$5 \times 10^{15}$/cm$^3$.

11. The method of claim 8, wherein said injecting step comprises injecting the impurity ions together with a gas comprising at least one non-volatile gas selected from the group consisting of Ar, Xe, and Kr.

12. A method for fabricating a semiconductor device comprising:
forming continuous linear trench lines on a semiconductor substrate;
forming gate oxide lines on the semiconductor substrate between the trench lines;
forming gate lines on the trench lines and the gate oxide lines, the gate lines being substantially perpendicular to the trench lines;
etching the gate oxide lines and the trench lines positioned between the gate lines to form an etched region;
injecting into the etched region first impurity ions of an element which is different from that of the semiconductor substrate and belongs to the same group as the substrate; and
forming a self aligned source (SAS) by injecting into the etched region second impurity ions of an element which belongs to a group different from that of the semiconductor substrate.

13. The method of claim 12, wherein the semiconductor substrate comprises a silicon wafer and the first impurity ions comprise Ge ions.

14. The method of claim 13, wherein the step of injecting first impurity ions comprises injecting the Ge ions at concentration of $1 \times 10^{14}$–$5 \times 10^{15}$/cm$^3$.

15. The method of claim 12, wherein the step of injecting first impurity ions comprises injecting the first impurity ions together with a gas comprising at least one non-volatile gas selected from the group consisting of Ar, Xe, and Kr.

16. The method of claim 12, the semiconductor substrate comprises a silicon wafer and the second impurity ions comprise one of As and P.

17. The method of claim 12, wherein the semiconductor substrate comprises a silicon wafer, and the second impurity ions comprise As and P ions, which are sequentially injected.

18. The method of claim 12, wherein the step of etching the gate oxide lines and the trench lines is performed using a mask which exposes parts of the gate lines and areas between the gate lines.

19. The method of claim 12, wherein, in the step of etching the gate oxide lines and the trench lines, an etching speed of a dielectric material constituting the trench lines is faster than an etching speed of the semiconductor substrate.

20. The method of claim 12, wherein the trench lines comprise an oxide layer, and the gate lines comprise a first polycrystalline silicon layer, a dielectric layer, and a second polycrystalline silicon layer.

* * * * *